United States Patent
Wang et al.

(10) Patent No.: US 10,115,836 B2
(45) Date of Patent: Oct. 30, 2018

(54) LEAD-BISMUTH-TELLURIUM-SILICATE INORGANIC REACTION SYSTEM HAVING IMPROVED ADHESION PROPERTIES

(71) Applicant: Heraeus Precious Metals North America Conshohocken LLC, West Conshohocken, PA (US)

(72) Inventors: Lei Wang, Conshohocken, PA (US); Cuiwen Guo, Horsham, PA (US); Raymond M. Cosimano, Philadelphia, PA (US); Li Yan, West Conshocken, PA (US); Brenton Yancey, Wilmington, DE (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 445 days.

(21) Appl. No.: 14/592,383

(22) Filed: Jan. 8, 2015

(65) Prior Publication Data

US 2015/0206986 A1    Jul. 23, 2015

Related U.S. Application Data

(60) Provisional application No. 61/928,720, filed on Jan. 17, 2014.

(51) Int. Cl.
| | | |
|---|---|---|
| *H01B 1/16* | (2006.01) | |
| *H01L 31/02* | (2006.01) | |
| *H01L 31/0224* | (2006.01) | |
| *C03C 8/10* | (2006.01) | |
| *C09D 5/24* | (2006.01) | |
| *C03C 3/07* | (2006.01) | |
| *C03C 8/18* | (2006.01) | |

(52) U.S. Cl.
CPC .......... *H01L 31/02008* (2013.01); *C03C 3/07* (2013.01); *C03C 8/10* (2013.01); *C03C 8/18* (2013.01); *C09D 5/24* (2013.01); *H01B 1/16* (2013.01); *H01L 31/022425* (2013.01); *Y02E 10/546* (2013.01)

(58) Field of Classification Search
CPC .................................. H01B 1/02; H01B 1/16
See application file for complete search history.

(56) References Cited

U.S. PATENT DOCUMENTS

| | | | |
|---|---|---|---|
| 4,235,644 A | 11/1980 | Needes | |
| 2006/0231803 A1 | 10/2006 | Wang et al. | |
| 2011/0232746 A1 | 9/2011 | Carroll et al. | |
| 2013/0068290 A1 | 3/2013 | Hang et al. | |
| 2013/0099177 A1 | 4/2013 | Rajendran | |
| 2014/0175340 A1* | 6/2014 | Choi | C03C 8/04 252/514 |
| 2015/0115207 A1* | 4/2015 | Shih | H01L 31/022425 252/514 |

FOREIGN PATENT DOCUMENTS

| | | |
|---|---|---|
| EP | 2703368 A1 | 3/2014 |
| JP | 3218943 A | 9/1991 |
| JP | 2003020251 A | 1/2003 |
| JP | 2014049743 A | 3/2014 |
| WO | WO-2009097264 A1 | 8/2009 |
| WO | WO-2013/085112 A1 | 6/2013 |
| WO | WO-2013/188485 A1 | 12/2013 |

OTHER PUBLICATIONS

Marko Udovic et al.; "Phase Formation and Crystal-Structure Determination in the $Bi_2O_3$—$TiO_2$—$TeO_2$ System Prepared in an Oxygen Atmosphere"; Journal of the American Ceramic Society; vol. 89; No. 11; Nov. 2006; pp. 3462-3469.

T. Maeder; "Review of $Bi_2O_3$ Based Glasses for Electronics and Related Applications"; International Materials Reviews; vol. 58; No. 1; 2013; pp. 3-40.

* cited by examiner

*Primary Examiner* — William D Young
(74) *Attorney, Agent, or Firm* — Blank Rome LLP; Charles R. Wolfe, Jr.; Cole T. Duncan

(57) ABSTRACT

An inorganic reaction system comprising a lead-bismuth-tellurium-silicate composition of Formula (I): $Pb_a$—$Bi_b$—$Te_c$—$Si_g$-$M_d$-$O_e$, wherein 0<a, b, c, d, or g≤1, 0≤d, e≤1, and the sum of a, b, c, d and g is 1, 0<a≤0.05, 0.2<b≤0.95, 0<c≤0.5, 0<d≤0.2, 0<g≤0.5, a:b is between about 0.1:99.9 to about 5:95, b:c is between about 50:50 to 99:1, a:c is between about 1:99 to about 10:90, b:g is between about 50:50 to about 98:2, M is one or more elements, and e is a number sufficient to balance the Pb, Bi, Te, Si, and M components.

15 Claims, No Drawings

LEAD-BISMUTH-TELLURIUM-SILICATE INORGANIC REACTION SYSTEM HAVING IMPROVED ADHESION PROPERTIES

RELATED APPLICATION

This application claims priority under 35 U.S.C. § 119 to U.S. Provisional Application No. 61/928,720 filed Jan. 17, 2014. The content of this application is hereby incorporated by reference.

TECHNICAL FIELD

This invention relates to a lead-bismuth-tellurium-silicate (PBTS) inorganic reaction system (IRS) that improves adhesion properties of an electroconductive paste containing the inorganic reaction system. In one aspect of the invention, an electroconductive paste composition utilized in solar panel technology, especially for forming front side electrical contacts, includes conductive particles, an organic vehicle, and the lead-bismuth-tellurium-silicate inorganic reaction system.

BACKGROUND

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. In operation, when light hits a solar cell, a fraction of the incident light is reelected by the surface and the remainder is transmitted into the solar cell. The photons of the transmitted light are absorbed by the solar cell, which is usually made of a semiconducting material such as silicon. The energy from the absorbed photons excites electrons of the semiconducting material from their atoms, generating electron-hole pairs. These electron-hole pairs are then separated by p-n junctions and collected by conductive electrodes applied on the solar cell surface.

Solar cells typically have electroconductive pastes applied to both their front and back surfaces. A front side paste, which typically includes silver, is screen printed onto the front side of the substrate to serve as a front electrode. A typical electroconductive paste contains conductive metallic particles, glass frit, and an organic vehicle. In some instances, the glass frit etches through an antireflection coating, such as a silicon nitride coating, on the surface of the silicon substrate upon firing, helping to build electrical contact between the conductive particles and the silicon substrate. At the same time, some known glass frits, which help to build electrical contact, also contribute to deteriorated adhesion of the paste to the silicon substrate. As a result, the adhesive performance and reliability of the solar cell may be reduced.

Thus, an IRS which provides improved adhesion between the electroconductive paste and the underlying substrate so as to achieve enhanced solar cell efficiency is desired.

SUMMARY

The invention provides an inorganic reaction system which, when used in an electroconductive paste, improves adhesion of the paste with the underlying silicon substrate.

The invention also provides an inorganic reaction system comprising a lead-bismuth-tellurium-silicate composition of Formula (I): $Pb_a$—$Bi_b$—$Te_c$—$Si_g$-$M_d$-$O_e$, wherein 0<a, b, c, d, or g≤1, 0≤d, e≤1, and the sum of a, b, c, d and g is 1, 0<a≤0.05, 0.2<b≤0.95, 0<c≤0.5, 0<d≤0.2, 0<g≤0.5, a:b is between about 0.1:99.9 to about 5:95, b:c is between about 50:50 to 99:1, a:c is between about 1:99 to about 10:90, b:g is between about 50:50 to about 98:2, M is one or more elements, and e is a number sufficient to balance the Pb, Bi, Te, Si, and M components.

Another aspect of the invention relates to an electroconductive paste comprising metallic particles, at least one inorganic reaction system of the invention, and an organic vehicle.

Another aspect of the invention is a solar cell produced by applying the electroconductive paste of the invention to a silicon wafer and firing the silicon wafer.

The invention also provides a solar cell module comprising electrically interconnected solar cells according to the invention.

Another aspect of the invention is a method of producing a solar cell, including the steps of providing a silicon wafer having a front side and a backside, applying the electroconductive paste of the invention to the silicon wafer, and firing the silicon wafer.

DETAILED DESCRIPTION

The invention relates to a PBTS inorganic reaction system. While not limited to such an application, the PBTS IRS composition may be used in an electroconductive paste composition, such as those used in silicon solar cells, alone or in combination with other IRS compositions. The electroconductive paste composition preferably comprises conductive metallic particles, an organic vehicle, the PBTS IRS composition, and one or more other inorganic reaction systems, such as an inorganic reaction system which improves contact between the electroconductive paste and the underlying silicon substrate (referred to herein as a contact-promoting inorganic reaction system). The electroconductive paste composition may further comprise one or more additional additives. When applied to silicon solar cells, such pastes may be used to form an electrical contact layer or electrode, either on the front side or backside of the silicon wafer.

In one preferred embodiment, the electroconductive paste is used on the front side of a silicon wafer for a solar cell and includes silver conductive particles, the PBTS IRS composition, an organic vehicle, and optionally a contact-promoting IRS. In other embodiments, the IRS may include a combination of multiple PBT (lead-bismuth-tellurium) glass compositions, lead silicate glass compositions, lead borosilicate glass compositions, bismuth tellurite glass compositions, PBTS glass compositions with PBTS-containing compounds, or PBTS-containing compounds (e.g., organometallic compounds, salts) that form a PBTS IRS during physical processing (e.g., mechanochemical processing, milling, grinding) or chemical processing (e.g., firing, thermal decomposition, photo or radiochemical decomposition). In other embodiments, the elements forming the IRS may be present in a single component or distributed among two or more components, which may be amorphous or crystalline or partially crystalline.

Inorganic Reaction System

The invention relates to an IRS for use, for example, in an electroconductive paste composition. The IRS serves multiple functions when used in an electroconductive paste composition. First, the IRS provides a delivery media for the conductive particles, allowing them to sinter and migrate from the paste to the interface of the semiconductor substrate. The IRS system also provides a reaction media for the paste components to undergo physical and chemical reactions at the interface when subjected to elevated temperatures. Physical reactions include, but are not limited to, melting, dissolving, diffusing, sintering, precipitating, and crystallizing. Chemical reactions include, but are not limited to, synthesis (forming new chemical bonds) and decomposition, reduction and oxidation, and phase transitioning.

Further, the IRS also acts as an adhesion media that provides bonding between the conductive particles and the semiconductor substrate, thereby improving electrical contact performance during the lifetime of the solar device. Without being bound by any particular theory, the presence of the PBTS IRS is believed to improve the adhesive properties of the paste.

The IRS may include glass material(s), ceramic material(s), any other compound(s) known in the art to form a reactive matrix at an elevated temperature. In one embodiment, the IRS may include at least one substantially amorphous glass frit. In another embodiment, the IRS may incorporate crystalline phases or compounds, or a mixture of amorphous, partially crystalline, and/or crystalline materials. The IRS may also include other oxides or compounds known in the art. For example, oxides of magnesium, nickel, tellurium, tungsten, zinc, gadolinium, antimony, cerium, zirconium, titanium, manganese, tin, ruthenium, cobalt, iron, copper and chromium, or any combination of at least two thereof, preferably zinc, antimony, manganese, nickel, tungsten, tellurium and ruthenium, or a combination of at least two of the compounds which can generate those metal oxides upon firing, or a mixture of at least two of the aforementioned metals, a mixture of at least two of the aforementioned oxides, a mixture of at least two of the aforementioned compounds which can generate those metal oxides on firing, or mixtures of two or more of any of the above mentioned, may be used. Other glass matrix formers or glass modifiers, such as germanium oxide, vanadium oxide, molybdenum oxides, niobium oxides, indium oxides, other alkaline and alkaline earth metal (e.g., K, Rb, Cs, Cu, Sr, and Ba) compounds, rare earth oxides (e.g., $La_2O_3$, cerium oxides), phosphorus oxides or metal phosphates, and metal halides (e.g., lead fluorides and zinc fluorides) may also be used as additives to adjust properties such as the glass transition temperature of the IRS. In one embodiment, the IRS may contain a combination of at least one glass and at least one oxide or additive.

PBTS Inorganic Reaction System

According to one embodiment, the PBTS IRS may be expressed by the following formula:

$$Pb_a\text{—}Bi_b\text{—}Te_c\text{—}Si_g\text{-}M_d\text{-}O_e \quad \text{(Formula I)}$$

where $0<a$, b, d, or $g \le 1$, $0 \le c \le 0.5$, $0 \le d$, $e \le 1$, and the sum of a, b, c, d and g is 1. M is one or more elements which can act as glass formers. The variable "e" charge balances the $Pb_a\text{—}Bi_b\text{—}Te_c\text{-}M_d$ components.

Preferably, the variable "a" is no more than 0.05, preferably no more than 0.03, preferably no more than 0.02, and most preferably no more than 0.01. It is preferred that only a relatively small amount of lead is included in the PBTS IRS. The variable "b" is preferably greater than 0.2, and more preferably greater than 0.5. At the same time, the variable "b" is preferably no more than 0.95. The variable "c" is preferably at least 0.05, and more preferably at least 0.1. At the same time, variable "c" is preferably no more than about 0.5, and preferably no more than about 0.3. The variable "d" is preferably at least about 0.002, and more preferably at least about 0.01. At the same time, variable "d" is preferably no more than about 0.3, and preferably no more than about 0.1. The variable "g" is preferably at least 0.05, and more preferably at least 0.1. At the same time, variable "g" is preferably no more than about 0.5, and preferably no more than about 0.3. The PBTS IRS is preferably rich in bismuth and additional metal, while being relatively low in lead and tellurium.

The ratio of lead to bismuth, or a:b, is preferably between about 0.1:99.9 and about 5:95. More preferably, the a:b ratio is between about 1:99 and about 8:92. The ratio of bismuth to tellurium, or b:c, is preferably between about 50:50 and about 99:1. More preferably, the b:c ratio is between about 70:30 and about 95:5. The ratio of lead to tellurium, or a:c, is preferably about 1:99 to about 10:90. More preferably, the a:c ratio is between about 1:99 and about 50:50, and more preferably a:c is between about 20:80 and less than about 30:70. The ratio of bismuth to silicon, or b:g, is between about 50:50 to about 98:2, and preferably between about 60:40 to 90:10.

Other glass matrix formers may also be used to form the PBT IRS, as designed by "M" in Formula I. Suitable compounds include, but are not limited to, compounds of alkaline metals, alkaline earth metals, rare earth metals, boron, aluminum, gallium, germanium, tin, phosphorus, antimony, niobium, tantalum, vanadium, titanium, molybdenum, tungsten, chromium, silver, and any combinations thereof. Preferably, the starting materials containing these elements are oxides, such as, for example ZnO, $WO_3$, $Li_2O$, $Na_2O$, CaO, $Al_2O_3$, $MoO_3$, MgO, $Cr_2O_3$, $P_2O_5$, $B_2O_3$, $Li_2CO_3$, $V_2O_5$, $Ta_2O_5$, and $Ag_2O$. Metal halides, such as AgI or $PbF_2$, may also be used.

Formula I is preferably formulated as a one-glass composition, whereby the starting components of the IRS (i.e., Pb, Bi, Te, Si, and additional element) all chemically react to form one complex compound or composite, instead of a glass having a physical mixture of various oxides. Alternatively, the additional element component may be included outside of Formula I as an additive to the IRS.

The PBTS IRS may be formed of amorphous, crystalline or partially crystalline starting materials. The elements forming the IRS may be present in a single component or distributed among two or more components. Preferably, the starting materials used to prepare the IRS compositions are lead oxide (e.g., PbO), bismuth oxide (e.g., $Bi_2O3$), tellurium oxide (e.g. $TeO_2$), and silicon oxide (e.g., $SiO_2$), as well as any of the metal oxides set forth above. However, any known lead, bismuth, tellurium and silicon-containing compositions which may be used to formulate a PBTS system according to Formula I may be used. According to one embodiment, the starting materials used to prepare the PBTS composition comprise no more than about 1 wt % lead-containing compound, preferably no more than about 0.5 wt % lead-containing compound, based upon 100% total weight of the IRS. If present, the starting materials comprise at least about 0.05 wt % lead-containing compound. According to another embodiment, the starting materials preferably comprise at least about 30 wt % bismuth-containing compound, preferably at least about 40 wt %, more preferably at least about 50 wt %, and most preferably at least about 60 wt %, based upon 100% total weight of the IRS. At the same time, the starting materials preferably include no more than about 95 wt % bismuth-containing compound, and preferably no more than about 85 wt %. According to another embodiment, the starting materials preferably comprise no more than about 20 wt % tellurium-containing compound, and preferably no more than about 15 wt %, based upon 100% total weight of the IRS. If present, the starting materials comprise at least about 2 wt % tellurium-containing compound, preferably at least about 3 wt %, and most preferably at least about 4 wt %. According to yet another embodiment, the starting materials used to form a PBTS IRS preferably include at least about 5 wt % silicon-containing compound, preferably at least about 6 wt %, more preferably at least about 7 wt %, and most preferably at least about 8 wt %, based upon 100% total weight of the IRS. At the same time, the starting materials preferably include no more than about 55 wt % silicon-containing compound, preferably no more than about 45 wt %, and most preferably no more than about 35 wt %. In another embodiment, the starting materials preferably include no more than about 10 wt % of the silicon-containing compound.

In other embodiments, the IRS may include a combination of multiple glass compositions, such as a PBTS glass with other glass compositions, multiple PBT glass compositions (as defined above), lead silicate glass compositions, lead borosilicate glass compositions, bismuth tellurite glass compositions, PBTS glass compositions with PBTS-containing compounds, or compounds (e.g., organometallic compounds, salts) that form a PBTS IRS during physical processing (e.g., mechanochemical processing, milling, grinding) or chemical processing (e.g., firing, thermal decomposition, photo or radiochemical decomposition). In other embodiments the elements forming the IRS may be present in a single component or distributed among two or more components, which may be amorphous or crystalline or partially crystalline.

In a preferred embodiment, the IRS includes a PBTS IRS composition with at least one other IRS composition which is included to improve the contact properties of the resulting electroconductive paste (the contact-promoting IRS).

The Contact-Promoting IRS

In one embodiment, the contact-promoting IRS may be formed of a lead-bismuth-tellurium (PBT) IRS expressed by the following formula:

$$Pb_a\text{—}Bi_b\text{—}Te_c\text{-}M_d\text{-}O_e \quad \text{(Formula II)}$$

where $0<a$, b, c, and $d\leq 1$, $a+b+c+d=1$, $0\leq d\leq 0.5$, M is one or more additional elements which can act as glass formers, and the variable "e" charge balances the $Pb_a$—$Bi_b$—$Te_c$-$M_d$ components. In a preferred embodiment, $0\leq d\leq 0.1$. The ratio of lead to bismuth, or a:b, is between 5:95 and 95:5. Preferably the a:b ratio is between 10:90 and 90:10. The ratio of lead to tellurium, or a:c, is between 10:90 and 90:10. More preferably, the a:c ratio is between 15:85 and less than about 30:70. The ratio of bismuth to tellurium, or b:c, is preferably between 5:95 and 95:5. More preferably, the b:c ratio is between 10:90 and 80:20. Further, the ratio of lead and bismuth to tellurium, or (a+b)/c, is preferably between 10:90 and 90;10, more preferably between 20:80 and 80:20.

The PBT IRS may be formed of crystalline or partially crystalline materials. Preferably, the starting materials used to prepare the PBT IRS are lead oxide (e.g., PbO), bismuth oxide (e.g., $Bi_2O_3$), and tellurium oxide (e.g., $TeO_2$). However, any known lead, bismuth, or tellurium-containing compositions which may be used to formulate a PBT IRS according to Formula II may be used. According to one embodiment, the starting materials used to prepare the PBT composition comprise no more than about 45 wt % lead-containing compound (e.g., PbO), preferably no more than about 40 wt %, and most preferably no more than about 38 wt %, based upon 100% total weight of the IRS. At the same time, the materials preferably comprise at least about 5 wt % lead-containing compound, and preferably at least about 8 wt %. According to another embodiment, the starting materials preferably comprise at least about 10 wt % bismuth-containing compound (e.g, $Bi_2O_3$), preferably at least about 17 wt %. At the same time, the starting materials preferably comprise no more than about 50 wt % bismuth-containing compound, preferably no more than about 40 wt %, and most preferably no more than about 38 wt %. According to another embodiment, the starting materials comprise at least about 10 wt % tellurium-containing compound, preferably at least about 15 wt %, and most preferably at least about 20 wt %. At the same time, the materials preferably comprise no more than about 70 wt % tellurium-containing compound, preferably no more than about 60 wt %, and most preferably no more than about 55 wt %.

Other glass matrix formers may also be used to form the PBT IRS, as designed by "M" in Formula II. Suitable compounds include, but are not limited to, alkaline metals, alkaline earth metals, rare earth metals, boron, aluminum, gallium, silicon, germanium, tin, phosphorus, antimony, niobium, tantalum, vanadium, titanium, molybdenum, tungsten, chromium, silver, lead and any combinations thereof. Preferably, the starting materials containing these metals are metal oxides. Metal halides, such as AgI or $PbF_2$, may also be used.

In one preferred embodiment, the PBT IRS includes lithium, boron, silicon, or any combination thereof. If present, the starting materials of the IRS include at least about 0.1 wt % of the above-referenced elements. At the same time, they include no more than about 30 wt % of these elements, and preferably no more than about 20 wt %, based upon 100% total weight of the starting materials.

The contact-promoting IRS may also be formed of other IRS compositions, such as, for example, a lead-bismuth-tellurium-zinc IRS, lead-bismuth-tellurium-magnesium IRS, lead silicate glasses, lead borosilicate glasses, lead-free bismuth borosilicate glasses, bismuth silicate glass, and bismuth tellurite glasses. The contact-promoting IRS may include a combination of multiple glass compositions, such as a PBT glass with other glass compositions, glass compositions with PBT-containing compounds, or compounds (e.g., organometallic compounds, salts) that form a PBT IRS during physical processing (e.g., mechanochemical processing, milling, grinding) or chemical processing (e.g., firing, thermal decomposition, photo or radiochemical decomposition). The contact-promoting IRS may be formed of amorphous, crystalline or partially crystalline starting materials, and the elements forming the contact-promoting IRS may be present in a single component or distributed among two or more components.

Formation of IRS

The PBTS IRS may be formed by any method known in the art, including solid state synthesis, melting and quenching, or other Chimie Douce (soft chemistry) processes. In a typical melting and quenching process, the first step is to mix the appropriate amounts of the starting materials (usually in powder form). This mixture is then heated in air or in an oxygen-containing atmosphere to form a melt. The melt is then quenched, and then it is ground, ball milled, and screened, in order to provide a mixture with the desired particle size. For example, components in powder form may be mixed together in a V-comb blender. The mixture is then heated (e.g., to around 800-1200° C.) for about 30-40 minutes such that the starting materials may react to form a one-glass system. The IRS is then quenched, taking on a sand-like consistency. This coarse powder is milled, such as in a ball mill or jet mill, until a fine powder results. The IRS particles may be milled to an average particle size ($d_{50}$) of about 0.01-20 µm, preferably about 0.1-5 µm. In one embodiment, the IRS particles may be formed as nano sized particles having a $d_{50}$ ranging from about 5 to about 100 nm.

Chimie Douce (soft chemistry) processes are carried out at temperatures of about 20° C. to about 500° C. Chimie Douce reactions are topotactic, meaning that structural elements of the reactants are preserved in the product, but the composition changes. Such processes include, but are not limited to, sol-gel processes, precipitation, hydrothermal/solvothermal processes, and pyrolysis.

Conventional solid state synthesis may also be used to prepare the IRS system described herein. In this process, raw starting materials are sealed in a fused quartz tube or tantalum or platinum tube under vacuum, and then heated to about 700-1200° C. The materials dwell at this elevated temperature for about 12-48 hours and then are slowly cooled (about 0.1° C./minute) to room temperature. In some cases, solid state reactions may be carried out in an alumina crucible in air.

Yet another process for preparing the IRS system is co-precipitation. In this process, the metal elements are reduced and co-precipitated with other metal oxides or hydroxides to form a solution containing metal cations by adjusting the pH levels or by incorporating reducing agents. The precipitates of these metals, metal oxides or hydroxides are then dried and fired under vacuum at about 400-800° C. to form a fine powder.

Electroconductive Paste Composition

One aspect of the invention relates to an electroconductive paste composition. A desired electroconductive paste is one which is highly conductive, so as to optimize the resulting solar cell's electrical performance. The electroconductive paste composition is generally comprised of metallic particles, organic vehicle, and the PBTS IRS composition discussed herein. According to one embodiment, the electroconductive paste comprises: (i) at least about 50 wt % and no more than about 95 wt % metallic particles; (ii) at least about 0.05 wt % and no more than about 10 wt % IRS; and (iii) at least about 1 wt % and no more than about 25 wt % organic vehicle, based upon 100% total weight of the paste. In a preferred embodiment, the paste includes at least about 0.1 wt % of the PBTS IRS, based upon 100% total weight of the paste. At the same time, the paste preferably includes no more than about 5 wt % of the PBTS IRS, preferably no more than about 3 wt % of the PBTS IRS.

In another embodiment, where the paste is used to form floating busbars, or where it is used to print a second layer of electroconductive material in a double-printing application, the paste may include at least about 0.05 wt % PBTS IRS, and preferably at least about 0.1 wt %, based upon 100% total weight of the paste. At the same time, the paste preferably includes no more than about 10 wt % PBTS IRS, and preferably no more than about 5 wt % PBTS IRS.

According to one embodiment of the invention, the IRS should have a glass transition temperature ($T_g$) below the desired firing temperature of the electroconductive paste. Preferred IRS components have a $T_g$ of at least about 250° C., preferably at least 300° C., and most preferably at least 350° C. At the same time, preferred IRS materials have a $T_g$ of no more than about 750° C., preferably no more than about 700° C., and most preferably no more than about 650° C., when measured using thermomechanical analysis. Specifically, the $T_g$ may be determined using a DSC apparatus, TA Instruments SDT Q600 Simultaneous TGA/DSC (TA Instruments). For the measurements and data evaluation, the measurement software TA Universal Analysis 2000, V 4.5 A is applied. As pan for reference and sample, Alumina sample cups (commercially available from TA Instruments) with a diameter of 6.8 mm and a volume of about 90 µl are used. An amount of about 20-50 mg of the sample is weighted into the sample pan with an accuracy of 0.01 mg. The empty reference pan and the sample pan are placed in the apparatus, the oven is closed, and the measurement started. A heating rate of 10-50° C./min is employed from a starting temperature of 25° C. to an end temperature of 1000° C. The balance in the instrument is always purged with nitrogen ($N_2$ 5.0) and the oven is purged with synthetic air (80% $N_2$ and 20% $O_2$ from Linde) with a flow rate of 50 ml/min. The first step in the DSC signal is evaluated as glass transition using the software described above and the determined onset value is taken as the temperature for $T_g$.

It is well known in the art that IRS particles can exhibit a variety of shapes, sizes, and coating layers. For example, a large number of shapes of glass particles are known to the person skilled in the art. Some examples include spherical, angular, elongated (rod or needle like), and flat (sheet like, flakes). Glass particles may also be present as a combination of particles of different shapes (e.g., spheres and flakes). Glass particles with a shape, or combination of shapes, which favor advantageous adhesion of the produced electrode are preferred.

The median particle diameter $d_{50}$ is a characteristic of particles well known to the person skilled in the art. $D_{50}$ is the median diameter or the medium value of the particle size distribution. It is the value of the particle diameter at 50% in the cumulative distribution. Particle size distribution may be measured via laser diffraction, dynamic light scattering, imaging, electrophoretic light scattering, or any other method known in the art. A Horiba LA-910 Laser Diffraction Particle Size Analyzer connected to a computer with the LA-910 software program is used to determine the particle size distribution of the glass frit. The relative refractive index of the glass frit particle is chosen from the LA-910 manual and entered into the software program. The test chamber is filled with deionized water to the proper fill line on the tank. The solution is then circulated by using the circulation and agitation functions in the software program. After one minute, the solution is drained. This is repeated an additional time to ensure the chamber is clean of any residual material. The chamber is then filled with deionized water for a third time and allowed to circulate and agitate for one minute. Any background particles in the solution are eliminated by using the blank function in the software. Ultrasonic agitation is then started, and the glass fit is slowly added to the solution in the test chamber until the transmittance bars are in the proper zone in the software program. Once the transmittance is at the correct level, the laser diffraction analysis is run and the particle size distribution of the glass is measured and given as d50.

In a preferred embodiment, the median particle diameter $d_{50}$ of the IRS particles is at least about 0.1 µm, and preferably no more than about 20 µm, more preferably no more than about 5 µm, more preferably no more than about 2 µm, and most preferably no more than about 1 µm.

The IRS particles may be present with a surface coating. Any such coating known in the art and suitable in the context of the invention can be employed on the IRS particles. Preferred coatings are those coatings which promote improved adhesion characteristics of the electroconductive paste. If such a coating is present, it is preferred for that coating to be present in an amount of no more than 10 wt %, preferably no more than about 8 wt %, more preferably no more than about 5 wt %, more preferably no more than about 3 wt %, and most preferably no more than about 1 wt %, in each case based on the total weight of the IRS component.

Preferably, IRS particles have a specific surface area of at least about 0.1 m$^2$/g and no more than about 15 m$^2$/g, preferably at least about 1 m$^2$/g and no more than about 10 m$^2$/g. Methods of measuring specific surface area are known in the art. As set forth herein, all surface area measurements were performed using the BET (Brunauer-Emmett-Teller) method via a Monosorb MS-22 analyzer (manufactured by Quantachrome Instruments of Boynton Beach, Fla.) which operates according to the SMART method. Samples are prepared for analysis in the built-in degas station. Flowing gas sweeps away impurities, resulting in a clean surface upon which adsorption may occur. The sample can be heated to a user-selectable temperature with the supplied heating mantle. Digital temperature control and display are mounted on the instrument front panel. After degassing is complete, the sample cell is transferred to the analysis station. Quick connect fittings automatically seal the sample cell during transfer. With the push of a single button, analysis commences. A dewar flask filled with coolant is automatically raised, immersing the sample cell and causing adsorption. The instrument detects when adsorption is complete (2-3 minutes), automatically lowers the dewar flask, and gently heats the sample cell back to room temperature using a built-in hot-air blower. As a result, the desorbed gas signal is displayed on a digital meter and the surface area is directly presented on a front panel display. The entire measurement (adsorption and desorption) cycle typically requires less than six minutes. The technique uses a high sensitivity, thermal conductivity detector to measure the change in concentration of an adsorbate/inert carrier gas mixture as adsorption and desorption proceed. When integrated by the on-board electronics and compared to calibration, the detector provides the volume of gas adsorbed or desorbed. A built-in microprocessor ensures linearity and automatically computes the sample's BET surface area in m2/g.

Conductive Metallic Particles

The electroconductive paste also comprises conductive metallic particles. The electroconductive paste may comprise at least about 50 wt % metallic particles, preferably at least about 60 wt %, more preferably at least about 70 wt %, and most preferably at least about 80 wt %, based upon 100% total weight of the paste. At the same time, the paste preferably comprises no more than about 95 wt % of metallic particles, based upon 100% total weight of the paste.

All metallic particles known in the art, and which are considered suitable in the context of the invention, may be employed as the metallic particles in the electroconductive paste. Preferred metallic particles are those which exhibit conductivity and which yield electrodes having high efficiency and fill factor, and low series and grid resistance. Preferred metallic particles are elemental metals, alloys, metal derivatives, mixtures of at least two metals, mixtures of at least two alloys or mixtures of at least one metal with at least one alloy.

Preferred metals include at least one of silver, aluminum, gold, nickel, and copper, and alloys or mixtures thereof. In a preferred embodiment, the metallic particles comprise silver. In another preferred embodiment, the metallic particles comprise silver and aluminum. Suitable silver derivatives include, for example, silver alloys and/or silver salts, such as silver halides (e.g., silver chloride), silver nitrate, silver acetate, silver trifluoroacetate, silver orthophosphate, and combinations thereof. In one embodiment, the metallic particles comprise a metal or alloy coated with one or more different metals or alloys, for example, silver particles coated with aluminum.

Like the IRS particles, the metallic particles can exhibit a variety of shapes, sizes, and coating layers. A large number of shapes are known in the art. Some examples are spherical, angular, elongated (rod or needle like) and flat (sheet like, flakes). Metallic particles may also be present as a combination of particles of different shapes (e.g., spheres and flakes). Metallic particles with a shape, or combination of shapes, which favor improved conductivity are preferred. One way to characterize such shapes without considering the surface nature of the particles is through the following parameters: length, width and thickness. In the context of the invention, the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle. In one embodiment, metallic particles with shapes as uniform as possible are preferred (i.e. shapes in which the ratios relating the length, the width and the thickness are as close as possible to 1; preferably at least 0.7, more preferably at least 0.8, and most preferably at least 0.9, and preferably no more than about 1.5, preferably no more than about 1.3, and most preferably no more than about 1.2). Examples of preferred shapes for the metallic particles in this embodiment are spheres and cubes, or combinations thereof, or combinations of one or more thereof with other shapes. In another embodiment, metallic particles are preferred which have a shape of low uniformity, preferably with at least one of the ratios relating the dimensions of length, width and thickness being above about 1.5, more preferably above about 3 and most preferably above about 5. Preferred shapes according to this embodiment are flake shaped, rod or needle shaped, or a combination of flake shaped, rod or needle shaped with other shapes.

It is preferred that the median particle diameter $d_{50}$, as set forth herein, of the metallic particles is at least about 0.1 µm, and preferably no more than about 10 µm, preferably no more than about 8 µm, more preferably no more than about 7 µm, and most preferably no more than about 5 µm.

Further, preferable metallic particles have a specific surface area of at least about 0.1 m$^2$/g and no more than about 10 m$^2$/g. According to a preferred embodiment, silver powders having a specific surface area of at least about 0.2 m$^2$/g and no more than about 5 m$^2$/g are used. The specific surface area is measured according to the parameters set forth herein.

Additional components which contribute to more favorable contact properties and electrical conductivity are preferred. For example, the metallic particles may be present with a surface coating. Any such coating known in the art, and which is considered to be suitable in the context of the invention, may be employed on the metallic particles. Preferred coatings are those coatings which promote the adhesion characteristics of the resulting electroconductive paste. If such a coating is present, it is preferred that the coating be no more than about 10 wt %, preferably no more than about 8 wt %, and most preferably no more than about 5 wt %, based on 100% total weight of the metallic particles.

Organic Vehicle

The electroconductive paste of the invention also comprises an organic vehicle. In one embodiment, the organic vehicle is present in the electroconductive paste in an amount of at least about 0.01 wt % and no more than about 50 wt %, preferably no more than about 30 wt %, and most preferably no more than about 20 wt %, based upon 100% total weight of the paste.

Preferred organic vehicles in the context of the invention are solutions, emulsions or dispersions based on one or more solvents, preferably organic solvent(s), which ensure that the components of the electroconductive paste are present in a dissolved, emulsified or dispersed form. Preferred organic vehicles are those which provide optimal stability of the components of the electroconductive paste and endow the paste with a viscosity allowing effective printability.

In one embodiment, the organic vehicle comprises an organic solvent and one or more of a binder (e.g., a polymer), a surfactant and a thixotropic agent, or any combination thereof. For example, in one embodiment, the organic vehicle comprises one or more binders in an organic solvent.

Preferred binders in the context of the invention are those which contribute to the formation of an electroconductive paste with favorable stability, printability, viscosity and sintering properties. All binders which are known in the art, and which are considered to be suitable in the context of this invention, may be employed as the binder in the organic vehicle. Preferred binders (which often fall within the category termed "resins") are polymeric binders, monomeric binders, and binders which are a combination of polymers and monomers. Polymeric binders can also be copolymers wherein at least two different monomeric units are contained in a single molecule. Preferred polymeric binders are those which carry functional groups in the polymer main chain, those which carry functional groups off of the main chain and those which carry functional groups both within the main chain and off of the main chain. Preferred polymers carrying functional groups in the main chain are for example polyesters, substituted polyesters, polycarbonates, substituted polycarbonates, polymers which carry cyclic groups in the main chain, poly-sugars, substituted poly-sugars, polyurethanes, substituted polyurethanes, polyamides, substituted polyamides, phenolic resins, substituted phenolic resins, copolymers of the monomers of one or more of the preceding polymers, optionally with other co-monomers, or a combination of at least two thereof. According to one embodiment, the binder may be polyvinyl butyral or polyethylene. Preferred polymers which carry cyclic groups in the main chain are for example polyvinylbutylate (PVB) and its derivatives and poly-terpineol and its derivatives or mixtures thereof. Preferred poly-sugars are for example cellulose and alkyl derivatives thereof, preferably methyl cellulose, ethyl cellulose, hydroxyethyl cellulose, propyl cellulose, hydroxypropyl cellulose, butyl cellulose and their derivatives and mixtures of at least two thereof. Other preferred polymers are cellulose ester resins, e.g., cellulose acetate propionate, cellulose acetate buyrate, and any combinations thereof. Preferred polymers which carry functional groups off of the main polymer chain are those which carry amide groups, those which carry acid and/or ester groups, often called acrylic resins, or polymers which carry a combination of aforementioned functional groups, or a combination thereof. Preferred polymers which carry amide off of the main chain are for example polyvinyl pyrrolidone (PVP) and its derivatives. Preferred polymers which carry acid and/or ester groups off of the main chain are for example polyacrylic acid and its derivatives, polymethacrylate (PMA) and its derivatives or polymethylmethacrylate (PMMA) and its derivatives, or a mixture thereof. Preferred monomeric binders are ethylene glycol based monomers, terpineol resins or rosin derivatives, or a mixture thereof. Preferred monomeric binders based on ethylene glycol are those with ether groups, ester groups or those with an ether group and an ester group, preferred ether groups being methyl, ethyl, propyl, butyl, pentyl hexyl and higher alkyl ethers, the preferred ester group being acetate and its alkyl derivatives, preferably ethylene glycol monobutylether monoacetate or a mixture thereof. Alkyl cellulose, preferably ethyl cellulose, its derivatives and mixtures thereof with other binders from the preceding lists of binders or otherwise are the most preferred binders in the context of the invention. The binder may be present in an amount of at least about 0.1 wt %, and preferably at least about 0.5 wt %, based upon 100% total weight of the organic vehicle. At the same time, the binder may be present in an amount of no more than about 10 wt %, preferably no more than about 8 wt %, and more preferably no more than about 7 wt %, based upon 100% total weight of the organic vehicle.

Preferred solvents are components which are removed from the paste to a significant extent during firing. Preferably, they are present after firing with an absolute weight reduced by at least about 80% compared to before firing, preferably reduced by at least about 95% compared to before firing. Preferred solvents are those which contribute to favorable viscosity, printability, stability and sintering characteristics. All solvents which are known in the art, and which are considered to be suitable in the context of this invention, may be employed as the solvent in the organic vehicle. Preferred solvents are those which exist as a liquid under standard ambient temperature and pressure (SATP) (298.15 K, 25° C., 77° F.), 100 kPa (14.504 psi, 0.986 atm), preferably those with a boiling point above about 90° C. and a melting point above about −20° C. Preferred solvents are polar or non-polar, protic or aprotic, aromatic or non-aromatic. Preferred solvents are mono-alcohols, di-alcohols, poly-alcohols, mono-esters, di-esters, poly-esters, mono-ethers, di-ethers, poly-ethers, solvents which comprise at least one or more of these categories of functional group, optionally comprising other categories of functional group, preferably cyclic groups, aromatic groups, unsaturated bonds, alcohol groups with one or more O atoms replaced by heteroatoms, ether groups with one or more O atoms replaced by heteroatoms, esters groups with one or more O atoms replaced by heteroatoms, and mixtures of two or more of the aforementioned solvents. Preferred esters in this context are di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context are diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context are primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxy)ethanol, often known as carbitol, its alkyl derivatives, preferably methyl, ethyl, propyl, butyl, pentyl, and hexyl carbitol, preferably hexyl carbitol or butyl carbitol and acetate derivatives thereof, preferably butyl carbitol acetate, or mixtures of at least two of the aforementioned. The organic solvent may be present in an amount of at least about 60 wt %, and more preferably at least about 70 wt %, and most preferably at least about 80 wt %, based upon 100% total weight of the organic vehicle. At the same time, the organic solvent may be present in an amount of no more than about 99 wt %, more preferably no more than about 95 wt %, based upon 100% total weight of the organic vehicle.

The organic vehicle may also comprise one or more surfactants and/or additives. Preferred surfactants are those which contribute to the formation of an electroconductive paste with favorable stability, printability, viscosity and sintering properties. All surfactants which are known in the art, and which are considered to be suitable in the context of this invention, may be employed as the surfactant in the organic vehicle. Preferred surfactants are those based on linear chains, branched chains, aromatic chains, fluorinated chains, siloxane chains, polyether chains and combinations thereof. Preferred surfactants include, but are not limited to, single chained, double chained or poly chained polymers. Preferred surfactants may have non-ionic, anionic, cationic, amphiphilic, or zwitterionic heads. Preferred surfactants may be polymeric and monomeric or a mixture thereof. Preferred surfactants may have pigment affinic groups, preferably hydroxyfunctional carboxylic acid esters with pigment affinic groups (e.g., DISPERBYK®-108, manufactured by BYK USA, Inc.), acrylate copolymers with pigment affinic groups (e.g., DISPERBYK®-116, manufactured by BYK USA, Inc.), modified polyethers with pigment affinic groups (e.g., TEGO® DISPERS 655, manufactured by Evonik Tego Chemie GmbH), other surfactants with groups of high pigment affinity (e.g., TEGO® DISPERS 662 C, manufactured by Evonik Tego Chemie GmbH). Other preferred polymers not in the above list include, but are not limited to, polyethylene oxide, polyethylene glycol and its derivatives, and alkyl carboxylic acids and their derivatives or salts, or mixtures thereof. The preferred polyethylene glycol derivative is poly(ethyleneglycol)acetic acid. Preferred alkyl carboxylic acids are those with fully saturated and those with singly or poly unsaturated alkyl chains or mixtures thereof. Preferred carboxylic acids with saturated alkyl chains are those with alkyl chains lengths in a range from about 8 to about 20 carbon atoms, preferably $C_9H_{19}COOH$ (capric acid), $C_{11}H_{23}COOH$ (Laurie acid), $C_{13}H_{27}COOH$ (myristic acid) $C_{15}H_{31}COOH$ (palmitic acid), $C_{17}H_{35}COOH$ (stearic acid), or salts or mixtures thereof. Preferred carboxylic acids with unsaturated alkyl chains are $C_{18}H_{34}O_2$ (oleic acid) and $C_{18}H_{32}O_2$ (linoleic acid). The preferred monomeric surfactant is benzotriazole and its derivatives. If present, the surfactant may be at least about 0.01 wt %, based upon 100% total weight of the organic vehicle. At the same time, the surfactant is preferably no more than about 10 wt %, preferably no more than about 8 wt %, and more preferably no more than about 6 wt %, based upon 100% total weight of the organic vehicle.

Preferred additives in the organic vehicle are those materials which are distinct from the aforementioned components and which contribute to favorable properties of the electroconductive paste, such as advantageous viscosity, printability, stability and sintering characteristics. Additives known in the art, and which are considered to be suitable in the context of the invention, may be used. Preferred additives include, but are not limited to, thixotropic agents, viscosity regulators, stabilizing agents, inorganic additives, thickeners, emulsifiers, dispersants and pH regulators. Preferred thixotropic agents include, but are not limited to, carboxylic acid derivatives, preferably fatty acid derivatives or combinations thereof. Preferred fatty acid derivatives include, but are not limited to, $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) $C_{18}H_{34}O_2$ (oleic acid), $C_{18}H_{32}O_2$ (linoleic acid) and combinations thereof. A preferred combination comprising fatty acids in this context is castor oil.

Additives

According to another embodiment, the electroconductive paste may include additives distinct from the conductive particles, PBT IRS, and organic vehicle. Preferred additives contribute to increased performance of the electroconductive paste, of the electrodes produced thereof, or of the resulting solar cell. All additives known in the art, and which are considered suitable in the context of the invention, may be employed as additives in the electroconductive paste. Preferred additives include, but are not limited to, thixotropic agents, viscosity regulators, emulsifiers, stabilizing agents or pH regulators, inorganic additives, thickeners and dispersants, or a combination of at least two thereof. Inorganic additives are most preferred. Preferred inorganic additives include, but are not limited to, alkaline and alkaline earth metals, transition metals, such as nickel, zirconium, titanium, manganese, tin, ruthenium, cobalt, iron, copper and chromium tungsten, molybdenum, zinc; post-transition metals such as boron, silicon, germanium, tellurium, gadolinium, lead, bismuth, antimony, rare earth metals, such as lanthanum, cerium, oxides, mixed metal oxides, complex compounds, or amorphous or partially crystallized glasses formed from those oxides, or any combination of at least two thereof, preferably zinc, antimony, manganese, nickel, tungsten, tellurium and ruthenium, or a combination of at least two thereof, oxides thereof, compounds which can generate those metal oxides or glasses on firing, or a mixture of at least two of the aforementioned metals, a mixture of at least two of the aforementioned oxides, a mixture of at least two of the aforementioned compounds which can generate those metal oxides, mixed metal oxides, compounds or amorphous or partially glasses on firing, or mixtures of two or more of any of the above mentioned.

If present, the electroconductive paste composition may include at least about 0.1 wt % additive, based upon 100% total weight of the paste. At the same time, the paste preferably includes no more than about 10 wt %, preferably no more than about 5 wt %, and more preferably no more than about 2 wt % additive(s), based upon 100% total weight of the paste.

Forming the Electroconductive Paste Composition

To form the electroconductive paste composition, the IRS may be combined with the conductive metallic particles and the organic vehicle using any method known in the art for preparing a paste composition. The method of preparation is not critical, as long as it results in a homogenously dispersed paste. The components can be mixed, such as with a mixer, then passed through a three roll mill, for example, to make a dispersed uniform paste.

Solar Cells

In another aspect, the invention relates to a solar cell. In one embodiment, the solar cell is formed from a semiconductor substrate, for example a silicon wafer, and an electroconductive paste composition according to any of the embodiments described herein.

In another aspect, the invention relates to a solar cell prepared by a process comprising applying an electroconductive paste composition according to any of the embodiments described herein to a semiconductor substrate and firing the semiconductor substrate.

Silicon Wafer

Preferred wafers have regions, among other regions of the solar cell, capable of absorbing light with high efficiency to yield electron-hole pairs and separating holes and electrons across a boundary with high efficiency, preferably across a p-n junction boundary. Preferred wafers are those comprising a single body made up of a front doped layer and a back doped layer.

Preferably, the wafer comprises appropriately doped tetravalent elements, binary compounds, tertiary compounds or alloys. Preferred tetravalent elements in this context are silicon, Ge or Sn, preferably silicon. Preferred binary compounds are combinations of two or more tetravalent elements, binary compounds of a group III element with a group V element, binary corn-pounds of a group II element with a group VI element or binary compounds of a group IV element with a group VI element. Preferred combinations of tetravalent elements are combinations of two or more elements selected from silicon, germanium, tin or carbon, preferably SiC. The preferred binary compound of a group III element with a group V element is GaAs. According to a preferred embodiment, the wafer is silicon. The foregoing description, in which silicon is explicitly mentioned, also applies to other wafer compositions described herein.

The p-n junction boundary is located where the front doped layer and back doped layer of the wafer meet. In an n-type solar cell, the back doped layer is doped with an electron donating n-type dopant and the front doped layer is doped with an electron accepting or hole donating p-type dopant. In a p-type solar cell, the back doped layer is doped with p-type dopant and the front doped layer is doped with n-type dopant. According to a preferred embodiment, a wafer with a p-n junction boundary is prepared by first providing a doped silicon substrate and then applying a doped layer of the opposite type to one face of that substrate.

Doped silicon substrates are well known in the art. The doped silicon substrate can be prepared by any method known in the art and considered suitable for the invention. Preferred sources of silicon substrates are mono-crystalline silicon, multi-crystalline silicon, amorphous silicon and upgraded metallurgical silicon, most preferably mono-crystalline silicon or multi-crystalline silicon. Doping to form the doped silicon substrate can be carried out simultaneously by adding the dopant during the preparation of the silicon substrate, or it can be carried out in a subsequent step. Doping subsequent to the preparation of the silicon substrate can be carried out by gas diffusion epitaxy, for example. Doped silicon substrates are also readily commercially available. According to one embodiment, the initial doping of the silicon substrate may be carried out simultaneously to its formation by adding dopant to the silicon mix. According to another embodiment, the application of the front doped layer and the highly doped back layer, if present, may be carried out by gas-phase epitaxy. The gas phase epitaxy is preferably carried out at a temperature of at least about 500° C., preferably at least about 600° C., and most preferably at least about 650° C. At the same time, the gas phase epitaxy is preferably carried out at a temperature of no more than about 900° C., more preferably no more than about 800° C., and most preferably no more than about 750° C. The epitaxy is also preferably carried out at a pressure of at least 2 kPa, preferably at least about 10 kPa, and most preferably at least about 30 kPa. At the same time, the epitaxy is carried out at a pressure of no more than about 100 kPa, preferably no more than about 80 kPa, and most preferably no more than about 70 kPa.

It is known in the art that silicon substrates can exhibit a number of shapes, surface textures and sizes. The shape of the substrate may include cuboid, disc, wafer and irregular polyhedron, to name a few. According to a preferred embodiment, the wafer is a cuboid with two dimensions which are similar, preferably equal, and a third dimension which is significantly smaller than the other two dimensions. The third dimension may be at least 100 times smaller than the first two dimensions.

Further, a variety of surface types are known in the art. In one embodiment, silicon substrates with rough surfaces are preferred. One way to assess the roughness of the substrate is to evaluate the surface roughness parameter for a sub-surface of the substrate, which is small in comparison to the total surface area of the substrate, preferably less than about one hundredth of the total surface area, and which is essentially planar. The value of the surface roughness parameter is given by the ratio of the area of the sub-surface to the area of a theoretical surface formed by projecting that sub-surface onto the flat plane best fitted to the sub-surface by minimizing mean square displacement. A higher value of the surface roughness parameter indicates a rougher, more irregular surface and a lower value of the surface roughness parameter indicates a smoother, more even surface. The surface roughness of the silicon substrate is preferably modified so as to produce an optimum balance between numerous factors including, but not limited to, light absorption and adhesion to the surface.

The two larger dimensions of the silicon substrate can be varied to suit the application required of the resultant solar cell. It is preferred for the thickness of the silicon wafer to be at least about 0.01 mm. At the same time, the thickness is preferably no more than about 0.5 mm, more preferably no more than about 0.3 mm, and most preferably no more than about 0.2 mm. According to one embodiment, the silicon wafer may have a minimum thickness of 0.01 mm.

It is preferred that the front doped layer be thin in comparison to the back doped layer. It is also preferred that the front doped layer have a thickness of at least about 0.1 µm, and no more than about 10 µm, preferably no more than about 5 µm, and most preferably no more than about 2 µm.

A highly doped layer can be applied to the back face of the silicon substrate between the back doped layer and any further layers. Such a highly doped layer is of the same doping type as the back doped layer and such a layer is commonly denoted with a + (n+-type layers are applied to n-type back doped layers and p+-type layers are applied to p-type back doped layers This highly doped back layer serves to assist metallization and improve electroconductive properties. It is preferred for the highly doped back layer, if present, to have a thickness of at least about 1 µm, and no more than about 100 µm, preferably no more than about 50 µm, and most preferably no more than about 15 µm.

Dopants

Preferred dopants are those which, when added to the silicon wafer, form a p-n junction boundary by introducing electrons or holes into the band structure. It is preferred that the identity and concentration of these dopants is specifically selected so as to tune the band structure profile of the p-n junction and set the light absorption and conductivity profiles as required. Preferred p-type dopants are those which add holes to the silicon wafer band structure. All dopants known in the art and which are considered suitable in the context of the invention can be employed as p-type dopants. Preferred p-type dopants include, but are not limited to, trivalent elements, particularly those of group 13 of the periodic table. Preferred group 13 elements of the periodic table include, but are not limited to, boron, aluminum, gallium, indium, thallium, or a combination of at least two thereof, wherein boron is particularly preferred.

Preferred n-type dopants are those which add electrons to the silicon wafer band structure. All dopants known in the art and which are considered to be suitable in the context of the invention can be employed as n-type dopants. Preferred n-type dopants include, but are not limited to, elements of group 15 of the periodic table. Preferred group 15 elements include, but are not limited to, nitrogen, phosphorus, arsenic, antimony, bismuth, or a combination of at least two thereof, wherein phosphorus is particularly preferred.

As described above, the various doping levels of the p-n junction can be varied so as to tune the desired properties of the resulting solar cell.

According to certain embodiments, the semiconductor substrate (i.e., silicon wafer) exhibits a sheet resistance above about 60Ω/□, such as above about 65 Ω/□, 70 Ω/□, 90Ω/□, 95Ω/□, or 100Ω/□.

Solar Cell Structure

One aspect of the invention is a solar cell obtainable from the methods of the invention. Preferred solar cells are those which have a high efficiency, in terms of proportion of total energy of incident light converted into electrical energy output. Solar cells which are lightweight and durable are also preferred. At a minimum, a solar cell typically includes: (i) front electrodes, (ii) a front doped layer, (iii) a p-n junction boundary, (iv) a back doped layer, and (v) soldering pads. The solar cell may also include additional layers for chemical/mechanical protection.

Antireflective Layer

An antireflective layer may be applied as the outer layer before the electrode is applied to the front face of the solar cell. Preferred antireflective layers are those which decrease the proportion of incident light reflected by the front face and increase the proportion of incident light crossing the front face to be absorbed by the wafer. Antireflective layers which give rise to a favorable absorption/reflection ratio, are susceptible to etching by the electroconductive paste, are otherwise resistant to the temperatures required for firing of the electroconductive paste, and do not contribute to increased recombination of electrons and holes in the vicinity of the electrode interface are preferred. All antireflective layers known in the art and which are considered to be suitable in the context of the invention can be employed. Preferred antireflective layers include, but are not limited to, $SiN_x$, $SiO_2$, $Al_2O_3$, $TiO_2$ or mixtures of at least two thereof and/or combinations of at least two layers thereof. According to a preferred embodiment, the antireflective layer is $SiN_x$, in particular where a silicon wafer is employed.

The thickness of antireflective layers is suited to the wavelength of the appropriate light. According to a preferred embodiment of the invention, the antireflective layers have a thickness of at least about 20 nm, preferably at least about 40 nm, and most preferably at least about 60 nm. At the same time, the thickness is preferably no more than about 300 nm, preferably no more than about 200 nm, and most preferably no more than about 90 nm.

Passivation Layers

One or more passivation layers may be applied to the front and/or back side of the silicon wafer as an outer layer. The passivation layer(s) may be applied before the front electrode is formed, or before the antireflective layer is applied (if one is present). Preferred passivation layers are those which reduce the rate of electron/hole recombination in the vicinity of the electrode interface. Any passivation layer which is known in the art and which is considered to be suitable in the context of the invention can be employed. Preferred passivation layers include, but are not limited to, silicon nitride, silicon dioxide and titanium dioxide. According to a preferred embodiment, silicon nitride is used. It is preferred for the passivation layer to have a thickness of at least 0.1 nm, preferably at least about 10 nm, and most preferably at least about 30 nm. At the same time, the passivation layer is preferably no more than about 2 µm, more preferably no more than about 1 µm, and most preferably no more than about 200 nm.

Additional Protective Layers

In addition to the layers described above which directly contribute to the principle function of the solar cell, further layers may be added for mechanical and chemical protection.

The cell can be encapsulated to provide chemical protection. Encapsulations are well known in the art and any encapsulation suitable for the invention can be employed. According to a preferred embodiment, transparent polymers, often referred to as transparent thermoplastic resins, are used as the encapsulation material, if such an encapsulation is present. Preferred transparent polymers include, but are not limited to silicon rubber and polyethylene vinyl acetate (PVA).

A transparent glass sheet may also be added to the front of the solar cell to provide mechanical protection to the front face of the cell. Transparent glass sheets are well known in the art and any suitable transparent glass sheet suitable may be employed.

A back protecting material may be added to the back face of the solar cell to provide mechanical protection. Back protecting materials are well known in the art and any suitable back protecting material may be employed. Preferred back protecting materials are those having good mechanical properties and weather resistance. The preferred back protection material is polyethylene terephthalate with a layer of polyvinyl fluoride. It is preferred for the back protecting material to be present underneath the encapsulation layer (in the event that both a back protection layer and encapsulation are present).

A frame material can be added to the outside of the solar cell to give mechanical support. Frame materials are well known in the art and any frame material considered suitable in the context of the invention may be employed. The preferred frame material is aluminum.

Method of Preparing Solar Cell

A solar cell may be prepared by applying an electroconductive paste composition to an antireflective coating, such as silicon nitride, silicon oxide, titanium oxide or aluminum oxide, on the front side of a semiconductor substrate, such as a silicon wafer, to form front side electrodes. The backside electroconductive paste of the invention is then applied to the backside of the solar cell to form soldering pads. The electroconductive pastes may be applied in any manner known in the art and considered suitable in the context of the invention. Examples include, but are not limited to, impregnation, dipping, pouring, dripping on, injection, spraying, knife coating, curtain coating, brushing or printing or a combination of at least two thereof. Preferred printing techniques are ink-jet printing, screen printing, tampon printing, offset printing, relief printing or stencil printing or a combination of at least two thereof. It is preferred that the electroconductive paste is applied by printing, preferably by screen printing. Specifically, the screens preferably have linger line opening with a diameter of at least about 10 μm, more preferably at least about 20 μm, and most preferably at least about 35 μm. At the same time, the finger line opening diameter is preferably no more than about 100 μm, more preferably no more than about 80 μm, and most preferably no more than about 70 μm.

An aluminum paste is then applied to the backside of the substrate, overlapping the edges of the soldering pads formed from the backside electroconductive paste, to form the BSF. The substrate is then fired according to an appropriate profile determined by the substrate and the composition of the electroconductive paste.

Firing is necessary to sinter the printed electrodes and soldering pads on as to form solid conductive bodies. Firing is well known in the art and can be effected in any manner considered suitable in the context of the invention. It is preferred that firing be carried out above the $T_g$ of the IRS materials.

The maximum temperature set for firing is below about 900° C., preferably below about 860° C. Firing temperatures as low as about 820° C. have been employed for obtaining solar cells. The firing temperature profile is typically set so as to enable the burnout of organic binder materials from the electroconductive paste composition, as well as any other organic materials present. The firing step is typically carried out in air or in an oxygen-containing atmosphere in a belt furnace. It is preferred for firing to be carried out in a fast firing process with a total firing time in the range from about 30 seconds (s) to about 3 minutes, more preferably in the range from about 30 s to about 2 minutes, and most preferably in the range from about 40 s to about 1 minute. The time above 600° C. is most preferably in a range from about 3 to 7 s. The substrate may reach a peak temperature in the range of about 700 to 900° C. for a period of about 1 to 5 s. The firing may also be conducted at high transport rates, for example, about 100-500 cm/min, with resulting hold-up times of about 0.05 to 5 minutes. Multiple temperature zones, for example 3-12 zones, can be used to control the desired thermal profile.

Firing of electroconductive pastes on the front and back faces may be carried out simultaneously or sequentially. Simultaneous firing is appropriate if the electroconductive pastes applied to both faces have similar, preferably identical, optimum firing conditions. Where appropriate, it is preferred for firing to be carried out simultaneously. Where firing is carried out sequentially, it is preferable for the back electroconductive paste to be applied and fired first, followed by application and firing of the electroconductive paste to the front face.

Measuring Performance of Electroconductive Paste

Pull Force Test

One method used to measure the adhesive strength, also known as the pull force, of the resulting electroconductive paste is to apply a solder wire to the electroconductive paste layer which has been printed on the a silicon solar cell. A standard soldering wire is applied to the electrode either by an automated machine, such as Somont Cell Connecting automatic soldering machine (manufactured by Meyer Burger Technology Ltd.), or manually with a hand held solder gun according to methods known in the art. In the invention, a 0.70×0.20 mm copper ribbon with approximately 20 μm 62/36/2 solder coating was used, although other methods common in the industry and known in the art may be used. Specifically, a length of ribbon approximately 2.5 times the length of the solar cell is cut. A solder flux is coated onto the cut ribbon and allowed to dry for 1-5 minutes. The cell is then mounted into the soldering fixture and the ribbon is aligned on top of the electrode. The soldering fixture is loaded onto the preheat stage and the cell is preheated for 15 seconds at 150-180° C. After preheat, the soldering pins are lowered and the ribbon is soldered onto the electrode for 0.8-1.8 seconds at 220-250° C. With the copper wire soldered to the length of the electrode, the adhesion force is measured using a pull-tester such as GP Solar GP PULL-TEST Advanced. A tailing end of the soldered ribbon is attached to the force gauge on the pull-tester and peeled back at approximately 180° at a constant speed of 6 mm/s. The force gauge records the adhesive force in Newtons at a sampling rate of 100 $s^{-1}$.

When evaluating exemplary pastes, this solder and pull process is typically completed four times on four separate electrodes to minimize variation in the data that normally results from the soldering process. One individual measurement from one experiment is not highly reliable, as discrete variations in the soldering process can affect the results. Therefore, an overall average from four pulls is obtained and the averaged pull forces are compared between pastes. A minimum of 1 Newton pull force is desirable. The acceptable industry standard for adhesive strength is typically above 2 Newtons. Stronger adhesion with a pull force of at least 3, at least 4, at least 5, or at least 6 Newtons, is most desirable.

Solar Cell Module

Another aspect of the invention is a solar cell module formed of the solar cells of the invention. A plurality of solar cells may be arranged spatially and electrically interconnected to form a collective arrangement called a module. Preferred modules can have a number of arrangements, preferably a rectangular arrangement known as a solar panel.

A variety of ways to electrically connect solar cells, as well as a variety of ways to mechanically arrange and fix such cells to form collective arrangements, are well known in the art. Any such methods known in the art, and which are considered suitable in the context of the invention, may be employed. Preferred methods are those which result in a low mass to power output ratio, low volume to power output ration, and high durability. Aluminum is the preferred material for mechanical fixing of solar cells.

EXAMPLES

Example 1

A set of IRS compositions containing a PBTS IRS (G1-G6) were prepared with the components set forth in Table 1 below. A control was also prepared which included only a contact-promoting IRS, as set forth in Table 1. Samples were prepared in 100 g batches by mixing the individual oxide constituents in the amounts designated in Table 1. The oxide mixture was loaded into a 8.34 in$^3$ volume Colorado crucible. The crucible was then placed in an oven for 40 minutes at 800° C. to preheat the oxide mixture. After preheating, the crucible was moved into a refractory oven at 1300° C. for 15 minutes to melt the individual components into a glass mixture. The molten glass was then removed from the oven and poured into a bucket containing deionized water to quickly quench. This glass material was further processed in a 1 L ceramic jar mill. The jar mill was filled approximately halfway with ½" cylindrical alumina media, or 2 mm diameters yttrium stabilized zirconia (YTZ) grinding media, and deionized water. The glass was added to the jar mill and rolled for 8 hours at 60-80 RPM. After milling, the glass was filtered through a 325 mesh sieve and dried at 125° C. for 24 hours. All amounts are based on 100% total weight of the IRS.

TABLE 1

Exemplary PBTS IRS Compositions (G1-G6)

| | Contact IRS | G1 | G2 | G3 | G4 | G5 | G6 |
|---|---|---|---|---|---|---|---|
| PbO | 28.64 | 0.334 | 0.294 | 0.302 | 0.300 | 0.323 | 0.282 |
| TeO$_2$ | 48.95 | 9.556 | 8.406 | 4.316 | 4.292 | 9.249 | 8.063 |
| SiO$_2$ | — | 8.994 | 7.911 | 9.749 | 9.695 | 8.705 | 7.588 |
| Bi$_2$O$_3$ | 20.78 | 55.099 | 73.008 | 74.973 | 74.558 | 66.832 | 70.028 |
| M-Oxides | 1.64 | 26.02 | 10.68 | 10.96 | 11.46 | 14.89 | 14.04 |

To form each exemplary paste (P1-P6), about 88 wt % silver particles, about 10.3 wt % of organic vehicle, about 1.5 wt % of the contact-promoting IRS (Contact IRS), and about 0.2 wt % of each PBTS IRS composition, based upon 100% total weight of the paste, were each combined. A control paste (Control 1) having about 1.7 wt % of the Contact IRS and no PBTS IRS was also prepared.

Once the pastes were mixed to a uniform consistency, they were each screen printed onto the front side of a blank monocrystalline (MN) and multicrystalline (MC) silicon wafer using 250 mesh stainless steel, 5 µm EOM, at about a 30 µm wire diameter. The cell was then dried at an appropriate temperature. The silicon substrate, with the printed front side paste, was then fired at a peak temperature of approximately 700-975° C.

The adhesive performance (Newtons) was then measured according to the parameters set forth herein (see pull force test). The data was normalized to 1 with respect to Control 1, as set forth in Table 2 below. All exemplary pastes outperformed the control paste, which did not have the adhesion-promoting PBTS IRS component.

TABLE 2

Adhesive Performance of Control 1 Paste and Pastes P1-P6

| | Control 1 | P1 | P2 | P3 | P4 | P5 | P6 |
|---|---|---|---|---|---|---|---|
| Average adhesion on MC wafer | 1 | 2.8 | 3.4 | 2.8 | 3.2 | 3.4 | 3.8 |
| Average adhesion on MN wafer | 1 | 3.2 | 2.8 | 3 | 3 | 3 | 4 |

Example 2A

A second set of PBTS IRS compositions (G7-G12) was prepared with the starting materials set forth in Table 3 below, according to the parameters set forth in Example 1. All amounts are expressed in 100% total weight of the IRS.

TABLE 3

Exemplary PBTS IRS Compositions (G7-G12)

| | G7 | G8 | G9 | G10 | G11 | G12 |
|---|---|---|---|---|---|---|
| PbO | 0.52% | 0.55% | 0.55% | 0.50% | 0.54% | 0.50% |
| TeO$_2$ | 8.24% | 7.89% | 7.80% | 7.10% | 7.78% | 7.21% |
| SiO$_2$ | 7.75% | 7.43% | 8.81% | 6.68% | 7.61% | 6.78% |
| Bi$_2$O$_3$ | 71.04% | 67.95% | 67.22% | 71.51% | 71.51% | 72.57% |
| M-Oxides | 12.45% | 16.18% | 15.62% | 14.21% | 12.56% | 12.94% |

About 0.5 wt % of the PBTS IRS composition was then mixed with about 88 wt % silver, about 1.5 wt % of the Contact IRS of Example 1, and about 10 wt % organic vehicle according to the parameters set forth in Example 1 to form pastes P7-P12. A different control paste (Control 2) having about 2 wt % of the Contact IRS of Example 1 and no PBTS IRS was also prepared. The exemplary pastes were then screen printed onto MC silicon wafers according to the parameters of Example 1. The normalized adhesive performance of the pastes (as compared to Control 2) is set forth in Table 4 below. All exemplary pastes outperformed the Control 2 paste.

TABLE 4

Adhesive Performance of Control 2 Paste and Pastes P7-P12

| | Control 2 | P7 | P8 | P9 | P10 | P11 | P12 |
|---|---|---|---|---|---|---|---|
| Average adhesion on MC wafer | 1 | 4.8 | 5.8 | 5.4 | 5.4 | 5.6 | 6 |

Example 2B

Another set of exemplary pastes was prepared with the same PBTS IRS compositions of Example 2A (G7-G12), except that a different contact-promoting IRS was used, as set forth in Table 5 below. Contact IRS 2 contained zinc oxide as an M-oxide.

TABLE 5

Contact-Promoting IRS Composition

|  | Contact IRS 2 |
|---|---|
| PbO | 27.88% |
| TeO$_2$ | 47.86% |
| SiO$_2$ | — |
| Bi$_2$O$_3$ | 21.49% |
| M-Oxides | 2.77% |

These exemplary pastes contained about 88 silver, about 1.5 wt % of Contact IRS 2, about 0.5 wt % of G7-G12, and about 10 wt % organic vehicle. A control paste (Control 3) was prepared which included about 2 wt % of Contact IRS 2 and no PBT IRS composition. The normalized adhesive performance of these pastes is set forth in Table 6 below (as compared to Control 3). As it can be seen, even when using a different contact-promoting IRS, the PBTS IRS compositions still improve adhesive performance.

TABLE 6

Adhesive Performance with Different Contact-Promoting IRS (Contact IRS 2)

|  | Control 3 | P7-2 | P8-2 | P9-2 | P10-2 | P11-2 | P12-2 |
|---|---|---|---|---|---|---|---|
| Average adhesion on multicrystalline wafer | 1 | 3.88 | 5.13 | 4.00 | 6.00 | 5.88 | 5.00 |

Example 3

A third set of PBTS IRS compositions (G13-G18) was prepared with the starting materials set forth in Table 7 below, according to the parameters set forth in Example 1. All amounts are expressed in 100% total weight of the IRS.

TABLE 7

Exemplary PBTS IRS Compositions (G13-G18)

|  | G13 | G14 | G15 | G16 | G17 | G18 |
|---|---|---|---|---|---|---|
| PbO | 0.28% | 0.29% | 0.27% | 0.27% | 0.30% | 0.27% |
| Bi$_2$O$_3$ | 70.0% | 71.83% | 68.31% | 67.58% | 62.80% | 74.66% |
| Si$_2$O | 7.6% | 9.34% | 5.92% | 6.28% | 9.82% | 5.01% |
| TeO$_2$ | 8.1% | 4.14% | 11.80% | 6.67% | 13.04% | 5.01% |
| M-Oxides | 14.0% | 14.40% | 13.70% | 19.20% | 14.04% | 15.04% |

Each IRS composition (about 0.2 wt %) was then mixed with about 88 wt % silver, about 1.5 wt % of the Contact IRS of Example 1, and about 10.3 wt % organic vehicle according to the parameters set forth in Example 1. The exemplary pastes were then screen printed onto MC and MN silicon wafers according to the parameters of Example 1. The normalized adhesive performance of the pastes is set forth in Table 8 below (as compared to Control 1 of Example 1). All exemplary pastes outperformed Control 1 of Example 1.

TABLE 8

Adhesive Performance of Pastes P13-P18

|  | Control 1 | P13 | P14 | P15 | P16 | P17 | P18 |
|---|---|---|---|---|---|---|---|
| Average adhesion on MC wafer | 1 | 3 | 3.2 | 3.4 | 3.4 | 4.2 | 3.6 |

TABLE 8-continued

Adhesive Performance of Pastes P13-P18

|  | Control 1 | P13 | P14 | P15 | P16 | P17 | P18 |
|---|---|---|---|---|---|---|---|
| Average adhesion on MN wafer | 1 | 3.4 | 3.6 | 3.2 | 3.2 | 4.4 | 3.8 |

Example 4

A fourth set of PBTS IRS compositions (G19-G22) was prepared with the starting materials set forth in Table 9 below, according to the parameters set forth in Example 1. All amounts are expressed in 100% total weight of the IRS.

TABLE 9

Exemplary PBTS IRS Compositions (G19-G22)

|  | G19 | G20 | G21 | G22 |
|---|---|---|---|---|
| PbO | 0.29% | 2.21% | 0.28% | 0.28% |
| TeO$_2$ | 5.71% | 7.89% | 7.95% | 7.90% |
| Si$_2$O | 7.68% | 7.43% | 7.48% | 7.43% |
| Bi$_2$O$_3$ | 70.87% | 69.13% | 69.04% | 68.57% |
| M-Oxides | 15.46% | 13.34% | 15.25% | 15.83% |

Each IRS composition (about 0.2 wt %) was then mixed with about 88 wt % silver, about 1.5 wt % of the Contact IRS of Example 1, and about 10.3 wt % organic vehicle according to the parameters set forth in Example 1. The exemplary pastes were then screen printed onto MC silicon wafers according to the parameters of Example 1. The normalized adhesive performance of the exemplary pastes is set forth in Table 10 below (as compared to Control 1 of Example 1). All exemplary pastes outperformed the Control 1 of Example 1.

TABLE 10

Adhesive Performance of Pastes P7-P12

|  | Control 1 | P19 | P20 | P21 | P22 |
|---|---|---|---|---|---|
| Average adhesion on MC wafer | 1 | 4.2 | 3.8 | 3.6 | 3.8 |

Example 5

A fifth set of PBTS IRS compositions (G23-G25) was prepared with the starting materials set forth in Table 11 below, according to the parameters set forth in Example 1. All amounts are expressed in 100% total weight of the IRS.

TABLE 11

Exemplary PBTS IRS Compositions (G23-G25)

|  | G23 | G24 | G25 |
|---|---|---|---|
| PbO | 0.27% | 0.28% | 0.25% |
| TeO$_2$ | 3.84% | 7.99% | 7.20% |
| Si$_2$O | 7.60% | 9.02% | 8.80% |
| Bi$_2$O$_3$ | 69.58% | 69.41% | 78.26% |
| M-Oxides | 18.71% | 13.30% | 5.49% |

Each IRS composition (about 0.2) was then mixed with about 88 wt % silver, about 1.3 wt % of the Contact IRS of Example 1, and about 10.5 wt % organic vehicle according to the parameters set forth in Example 1. The exemplary pastes were then screen printed onto MC silicon wafers according to the parameters of Example 1. The normalized adhesive performance of the exemplary pastes is set forth in Table 12 below (as compared to Control 1 of Example 1). All exemplary pastes outperformed the control paste of Example 1.

TABLE 12

| Adhesive Performance of Pastes P7-P12 | | | | |
|---|---|---|---|---|
| | Control 1 | P19 | P20 | P21 |
| Average adhesion on MC wafer | 1 | 4.6 | 5.2 | 5 |

Example 6

Another set of PBTS IRS compositions can be prepared with the starting materials set forth in Table 13 below, according to the parameters set forth in Example 1. These compositions further include $Li_2O$ and/or $B_2O_3$. All amounts are based on 100% total weight of the IRS. The anticipated adhesive performance of pastes prepared with the prophetic IRS compositions, as compared to a control paste containing only a contact-promoting IRS, is set forth in Table 14 below.

TABLE 13

| Prophetic PBTS IRS Compositions (X1-X4) | | | | | | | |
|---|---|---|---|---|---|---|---|
| | X1 | X2 | X3 | X4 | X5 | X6 | X7 |
| PbO | 0.29% | 2.21% | 0.28% | 0.28% | 0.27% | 0.28% | 0.25% |
| $TeO_2$ | 5.71% | 7.89% | 7.95% | 7.90% | 3.84% | 7.99% | 7.20% |
| $Si_2O$ | 7.68% | 7.43% | 7.48% | 7.43% | 7.60% | 9.02% | 8.80% |
| $Bi_2O_3$ | 70.87% | 69.13% | 69.04% | 68.57% | 69.58% | 69.41% | 78.26% |
| $Li_2O$ | 5.93% | 5.73% | 5.77% | 3.44% | 5.58% | 5.80% | — |
| $B_2O_3$ | 9.53% | 7.61% | 9.48% | 12.38% | 13.12% | 7.50% | 5.49% |

TABLE 14

| Adhesive Performance of Prophetic Pastes with X1-X7 | | | | | | | | |
|---|---|---|---|---|---|---|---|---|
| | Control | X1 | X2 | X3 | X4 | X5 | X6 | X7 |
| Average adhesion on MC wafer | − | + | + | + | + | + | + | + |

Example 7

Another set of PBTS IRS compositions can be prepared with the starting materials set forth in Table 15 below, according to the parameters set forth in Example 1. These compositions all contain only the PBTS system. All amounts are based on 100% total weight of the IRS. The anticipated adhesive performance of pastes prepared with the prophetic IRS compositions, as compared to a control paste containing only a contact-promoting IRS, is set forth in Table 16 below.

TABLE 15

| Prophetic PBTS IRS Compositions (X8-X14) | | | | | | | |
|---|---|---|---|---|---|---|---|
| | X8 | X9 | X10 | X11 | X12 | X13 | X14 |
| PbO | 0.66% | 0.65% | 0.58% | 0.62% | 0.58% | 0.36% | 0.36% |
| $Bi_2O_3$ | 81.07% | 79.66% | 83.36% | 81.78% | 83.36% | 89.21% | 89.21% |
| $SiO_2$ | 8.86% | 10.45% | 7.79% | 8.70% | 7.79% | 5.19% | 5.19% |
| $TeO_2$ | 9.41% | 9.25% | 8.28% | 8.89% | 8.28% | 5.24% | 5.24% |

TABLE 16

| Adhesive Performance of Prophetic Pastes with X8-X14 | | | | | | | | |
|---|---|---|---|---|---|---|---|---|
| | Control | X8 | X9 | X10 | X11 | X12 | X13 | X14 |
| Average adhesion on MC wafer | − | + | + | + | + | + | + | + |

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

The invention claimed is:
1. An electroconductive paste comprising:
   metallic particles;
   at least one inorganic reaction system comprising a lead-bismuth-tellurium-silicate composition of Formula (I):

$$Pb_a\text{—}Bi_b\text{—}Te_c\text{—}Si_g\text{-}M_dO_e, \qquad (I)$$

wherein
   the sum of a, b, c, d and g is 1,
   $0 < a \leq 0.01$,
   $0.2 < b \leq 0.95$,
   $0 \leq c \leq 0.5$,
   $0 < d \leq 0.2$,
   $0 < g \leq 0.5$,
   a:b is between about 0.1:99.9 to about 5:95,
   b:c is between about 50:50 to 99:1,
   a:c is between about 1:99 to about 10:90,
   b:g is between about 50:50 to about 98:2, M is one or more elements selected from the group consisting of boron, aluminum, gallium, germanium, tin, phosphorus, antimony, niobium, tantalum, vanadium, titanium, molybdenum, tungsten, chromium, silver, halides, chalcogenides, alkaline metals, alkaline earth metals, and rare earth metals, and e is a number sufficient to balance the charge of the Pb, Bi, Te, Si, and M components; and an organic vehicle.

2. The inorganic reaction system according to claim 1, wherein b is greater than 0.5 and less than or equal to 0.95.

3. The inorganic reaction system according to claim 1, wherein c is at least 0.05, and no more than 0.3.

4. The inorganic reaction system according to claim 1, wherein d is at least about 0.002, and no more than 0.1.

5. The inorganic reaction system according to claim 1, wherein g is at least 0.05, and no more than about 0.3.

6. The inorganic reaction system according to claim 1, wherein b:c is between about 70:30 to about 95:5.

7. The inorganic reaction system according to claim 1, wherein b:g is between about 60:40 to 90:10.

8. The inorganic reaction system according to claim 1, wherein the lead-bismuth-tellurium-silicate composition is formed from at least about 0.05 wt % lead-containing compound, and no more than about 1 wt % lead-containing compound, based upon 100% total weight of the inorganic reaction system.

9. The inorganic reaction system according to claim 1, wherein the lead-bismuth-tellurium-silicate composition is formed from at least about 30 wt % bismuth-containing compound, and no more than about 90 wt % bismuth-containing compound, based upon 100% total weight of the inorganic reaction system.

10. The inorganic reaction system according to claim 1, wherein the lead-bismuth-tellurium-silicate composition is formed from at least about 2 wt % tellurium-containing compound, and no more than about 15 wt % tellurium-containing composition, based upon 100% total weight of the inorganic reaction system.

11. The inorganic reaction system according to claim 1, wherein the lead-bismuth-tellurium-silicate composition is formed from at least about 5 wt % silicon-containing compound, and no more than about 55 wt % silicon-containing composition, based upon 100% total weight of the inorganic reaction system.

12. The electroconductive paste according to claim 1, further comprising a contact-promoting inorganic reaction system.

13. The electroconductive paste according to claim 12, wherein the contact-promoting inorganic reaction system is a lead-bismuth-tellurium inorganic reaction system.

14. The electroconductive paste composition according to claim 1, wherein the electroconductive paste comprises at least about 1 wt % of the at least one inorganic reaction system, and no more than about 10 wt %, based upon 100% total weight of the paste.

15. An electroconductive paste comprising:

metallic particles;

at least one inorganic reaction system comprising a lead-bismuth-tellurium-silicate composition of Formula (I):

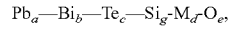

wherein 0<a≤0.01, 0.2<b≤0.95,

0≤c≤0.5,

0<d≤0.2,

0<g≤0.5, and the sum of a, b, c, d and g is 1, a:b is between about 0.1:99.9 to about 5:95, b:c is between about 50:50 to 99:1, a:c is between about 1:99 to about 10:90, b:g is between about 50:50 to about 98:2, and M is one or more elements selected from the group consisting of boron, aluminum, gallium, germanium, tin, phosphorus, antimony, niobium, tantalum, vanadium, titanium, molybdenum, tungsten, chromium, silver, halides, chalcogenides, alkaline metals, alkaline earth metals, and rare earth metals, and e is a number sufficient to balance the charge of the Pb, Bi, Te, Si, and M components; and an organic vehicle, wherein the at least one inorganic reaction system is formed from no more than about 1 wt % lead-containing compound based on 100% total weight of the inorganic reaction system.

* * * * *